United States Patent
Sukharev (12)

(10) Patent No.: US 6,506,678 B1
(45) Date of Patent: Jan. 14, 2003

(54) INTEGRATED CIRCUIT STRUCTURES HAVING LOW K POROUS ALUMINUM OXIDE DIELECTRIC MATERIAL SEPARATING ALUMINUM LINES, AND METHOD OF MAKING SAME

(75) Inventor: Valeriy Sukharev, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/574,771

(22) Filed: May 19, 2000

(51) Int. Cl.[7] .............................................. H01L 21/44
(52) U.S. Cl. ...................... 438/688; 438/788; 438/714; 438/765
(58) Field of Search ................................. 438/725, 740, 438/734, 714, 721, 688, 765, 768

(56) References Cited

U.S. PATENT DOCUMENTS

| | | | |
|---|---|---|---|
| 3,012,861 A | 12/1961 | Ling ........................ 23/223.5 |
| 3,178,392 A | 4/1965 | Kriner ....................... 260/46.5 |
| 3,652,331 A | 3/1972 | Yamazaki ................... 117/201 |
| 3,832,202 A | 8/1974 | Ritchie ....................... 106/287 |
| 3,920,865 A | 11/1975 | Läufer et al. ................ 427/220 |
| 4,705,725 A | 11/1987 | Glajch et al. ................ 428/405 |
| 4,771,328 A | 9/1988 | Malaviya et al. .............. 357/49 |
| 5,057,022 A | * 10/1991 | Miller ......................... 437/71 |
| 5,194,333 A | 3/1993 | Ohnaka et al. ............. 428/714 |
| 5,364,800 A | 11/1994 | Joyner ........................ 437/28 |
| 5,376,595 A | 12/1994 | Zupancic et al. ............. 501/12 |
| 5,470,801 A | 11/1995 | Kapoor et al. ............... 437/238 |
| 5,527,562 A | * 6/1996 | Balaba et al. ............. 437/430.1 |
| 5,558,718 A | 9/1996 | Leung .................... 118/723 E |
| 5,559,367 A | 9/1996 | Cohen et al. ................. 257/77 |
| 5,580,429 A | 12/1996 | Chan et al. ............. 204/192.38 |
| 5,628,871 A | 5/1997 | Shinagawa .................. 438/514 |
| 5,675,187 A | 10/1997 | Numata et al. .............. 257/758 |
| 5,688,724 A | 11/1997 | Yoon et al. .................. 437/235 |
| 5,858,879 A | 1/1999 | Chao et al. .................. 438/725 |
| 5,864,172 A | 1/1999 | Kapoor et al. ............... 257/634 |
| 5,874,745 A | 2/1999 | Kuo ............................. 257/59 |
| 5,882,489 A | 3/1999 | Bersin et al. ........... 204/192.35 |
| 5,904,154 A | 5/1999 | Chien et al. .................. 134/1.2 |
| 5,939,763 A | 8/1999 | Hao et al. .................... 257/411 |
| 5,976,988 A | * 11/1999 | Konuma et al. ............. 438/745 |
| 6,025,263 A | 2/2000 | Tsai et al. .................... 438/624 |
| 6,028,015 A | 2/2000 | Wang et al. ................. 438/789 |
| 6,037,248 A | 3/2000 | Ahn ............................ 438/619 |
| 6,051,073 A | 4/2000 | Chu et al. .................... 118/723 |

(List continued on next page.)

FOREIGN PATENT DOCUMENTS

JP     2000-267128    9/2000    ........... G02F/1/136

OTHER PUBLICATIONS

Koda, Seiichiro, et al., "A Study of Inhibition Effects for Silane Combustion by Additive Gases", *Combustion and Flame*, vol. 73, No. 2, Aug., 1988, pp. 187–194.

*Primary Examiner*—Matthew Smith
*Assistant Examiner*—Renzo N. Rocchegiani
(74) *Attorney, Agent, or Firm*—John P. Taylor

(57) ABSTRACT

An aluminum layer formed over an integrated circuit structure is patterned to form a plurality of aluminum metal lines. The patterned aluminum metal lines are then anodized in an acid anodizing bath to form anodized aluminum oxide on the exposed sidewall surfaces of the patterned aluminum. The anodization may be carried out until the anodized aluminum films on horizontally adjacent aluminum metal lines contact one another, or may be stopped prior to this point, leaving a gap between the anodized aluminum oxide films on adjacent aluminum metal lines. This gap may then be either filled with other low k dielectric material or by standard (non-low k) dielectric material. A capping layer of non-porous dielectric material is then formed over the porous anodized aluminum oxide.

7 Claims, 5 Drawing Sheets

U.S. PATENT DOCUMENTS

| | | | |
|---|---|---|---|
| 6,051,477 A | 4/2000 | Nam | 438/404 |
| 6,066,574 A | 5/2000 | You et al. | 438/781 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,160,269 A * | 12/2000 | Takemura et al. | 257/59 |
| 6,204,192 B1 | 3/2001 | Zhao et al. | 438/723 |
| 6,229,531 B1 * | 5/2001 | Nakajima et al. | 345/205 |
| 6,232,658 B1 | 5/2001 | Cataby et al. | 257/701 |
| 6,251,470 B1 * | 6/2001 | Forbes et al. | 427/97 |

* cited by examiner

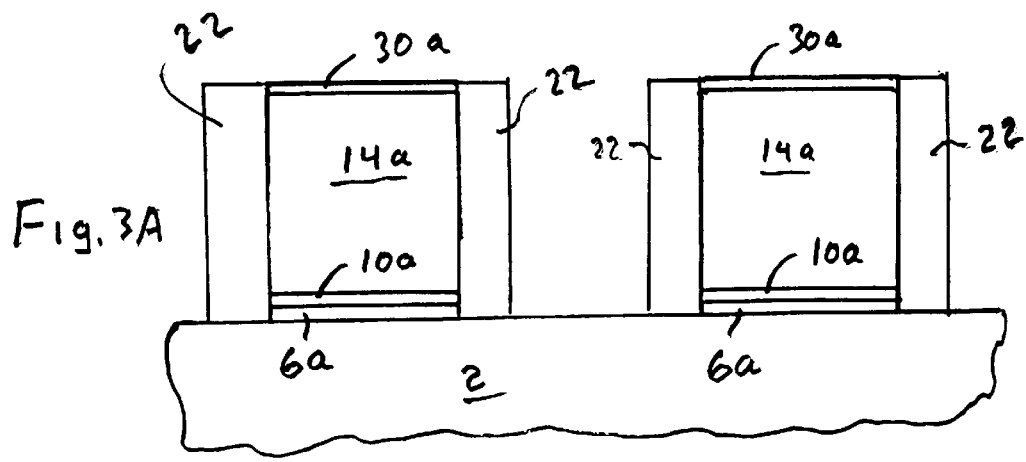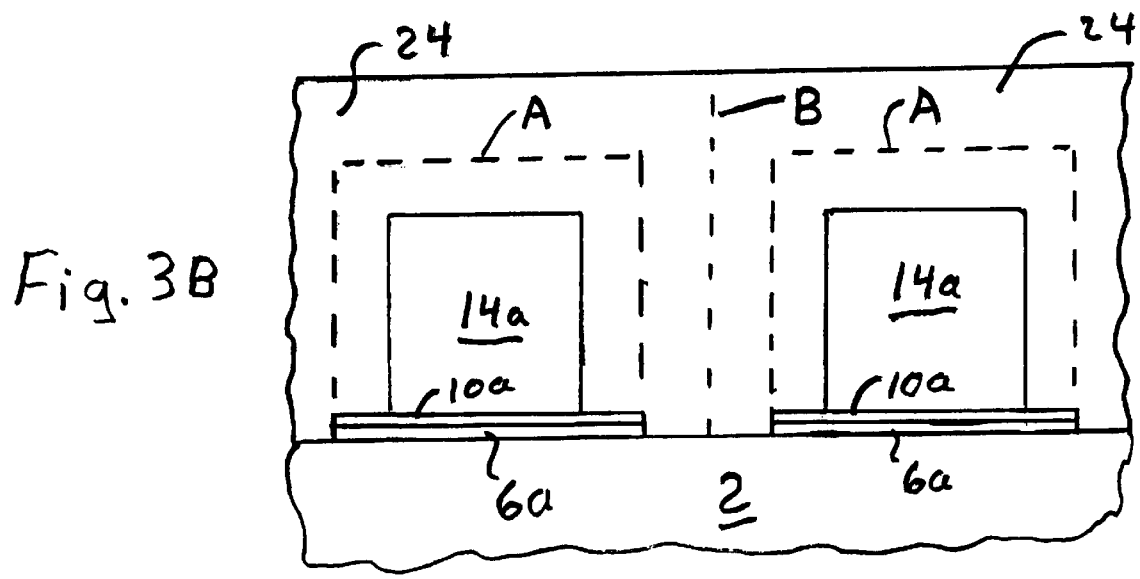

INTEGRATED CIRCUIT STRUCTURES HAVING LOW K POROUS ALUMINUM OXIDE DIELECTRIC MATERIAL SEPARATING ALUMINUM LINES, AND METHOD OF MAKING SAME

CROSS REFERENCE TO RELATED APPLICATION

The subject matter of this application relates to the subject matter of the copending application entitled "INTERCONNECTION SYSTEM WITH LATERAL BARRIER LAYER", assigned to the assignee of this application, and filed on the same date as this application.

BACKGROUND OF THE INVENTION

1. Field of the Invention

This invention relates to integrated circuit structures. More particularly, this invention relates to integrated circuit structures having low k porous aluminum oxide dielectric material formed between aluminum metal line structures.

2. Description of the Related Art

In the construction of integrated circuit structures, dielectric materials such as silicon oxide ($SiO_2$) have been conventionally used to electrically separate and isolate or insulate conductive elements of the integrated circuit structure from one another. However, as the spacings between such conductive elements in the integrated circuit structure have become smaller and smaller, the capacitance between such conductive elements through the silicon oxide dielectric has become of increasing concern. Such capacitance has a negative influence on the overall performance of the integrated circuit structure in a number of ways, including its effect on speed of the circuitry and cross-coupling (crosstalk) between adjacent conductive elements.

Because of this ever increasing problem of capacitance between adjacent conductive elements separated by conventional silicon oxide ($SiO_2$) insulation, as the scale of integrated circuit structures continues to reduce, the use of other insulation materials having lower dielectric constants than conventional silicon oxide has been proposed. These include the substitution of organic polymer dielectric material, the use of altered silicon oxide such as porous or fluorinated silicon oxide, and silicon oxide having incorporated hydrogen or hydrocarbon groups. Formation or deposition of these low k dielectric materials on a surface of an integrated circuit structure is generally carried using either a spin-on technology or chemical vapor deposition (CVD)—either thermal or plasma enhanced CVD (PECVD). Low k materials, such as polymers or porous silicon oxide, deposited by spin-on technology, usually exhibit a high level of internal stress that causes reliability problems. Materials deposited by CVD techniques, such as hydrocarbon-modified silicon oxide, are characterized by strong adhesion, but in some cases gap filling issues can arise, especially when using PECVD technology to form the desired film.

Dobson et al., in an article entitled "Advanced $SiO_2$ Planarization Using Silane and $H_2O_2$", published in Semiconductor International, December 1994, at pages 85–88, describe the low temperature formation of $SiO_2$ by reaction of silane ($SiH_4$) with hydrogen peroxide ($H_2O_2$) to produce a silicon oxide which flows like a liquid and thus exhibits good gap fill characteristics.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is then annealed to remove moisture. Such carbon-containing silicon oxide insulating materials formed in this manner, sometimes referred to as low k carbon-doped silicon oxide dielectric material, exhibit good gap-filling capabilities and at the same time are characterized by a dielectric constant less than 3.0 and remain stable during subsequent annealing at temperatures of up to 500° C.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The low dielectric constant (k) value of these types of materials is achieved by the incorporation of C—H containing groups into the $SiO_2$-based matrices. The larger the carbon concentration becomes in the $SiO_2$ polymer matrices, the lower the expected value of k. However, one of the major problems associated with this type of low k material is its poor oxidation resistance. Hydrocarbon groups introduced into the bulk of these materials can be easily damaged or destroyed by oxidizing agents during subsequent etching, chemical/mechanical polishing (C/MP), and photoresist stripping (ashing) processes.

It would, therefore, be desirable to provide an integrated circuit structure with at least one layer of low k material which combines the very low k and chemical inert characteristics of porous silicon oxide with the adhesion and low level of internal stress of CVD-based low k material, as well as good gap fill characteristics.

Lazarouk et al., in an article entitled "Anisotropy of Aluminum Porous Anodization Process for VLSI Planar Metallization", published at pages 651–6 of Advanced Metallization for Devices and Circuits—Science in 1994, describe the anodization of a masked aluminum layer to form metal interconnects as a substitute for etching of the masked aluminum layer, and the use of anodizing voltage as a control of the anisotropic versus isotropic anodization of the aluminum layer.

SUMMARY OF THE INVENTION

The invention comprises an integrated circuit structure having aluminum lines formed thereon which are at least horizontally separated from one another by low k porous aluminum oxide dielectric material formed by anodization of aluminum. In a first embodiment, an aluminum layer is formed over the integrated circuit structure and the aluminum layer is then patterned to form a plurality of aluminum metal lines or interconnects. The patterned aluminum metal lines are then anodized by contacting the exposed surfaces of the patterned aluminum metal lines with an anodizing material, such as an acid anodizing bath, while applying a positive anodizing voltage to the patterned aluminum metal to form anodized aluminum oxide on the exposed upper and sidewall surfaces of the patterned aluminum in contact with the anodizing material. Depending upon the spacing between adjacent aluminum metal lines and the initial thickness of the aluminum metal lines prior to anodization, the anodization may be carried out until the anodized aluminum films on horizontally adjacent aluminum metal lines contact one another, or may be stopped prior to this point, leaving a gap between the anodized aluminum oxide films on adjacent aluminum metal lines. This gap, depending upon its width, may then be either filled with other low k dielectric material or by standard (non-low k) dielectric material such as conventional silicon oxide ($SiO_2$). Finally, a capping layer of non-porous dielectric material, such as conventional silicon oxide ($SiO_2$), which may comprise the material formed in the gap between horizontally adjacent aluminum oxide films on aluminum lines, is formed over the porous anodized aluminum oxide to seal the surface of the porous aluminum oxide.

In a preferred modification of this embodiment, one or more electrically conductive layers are first formed over the integrated circuit structure respectively to facilitate adherence of the aluminum to underlying portions of the integrated circuit structure and to prevent interaction between aluminum and silicon in the underlying integrated circuit structure. Then an antireflective layer of electrically conductive material may be formed over the aluminum layer prior to the step of patterning the composite layer. This top layer may also serve to prevent interaction between the underlying aluminum and other metals formed over the resulting composite layer of metal lines. The resulting composite layer is then patterned prior to the anodization step.

In a second embodiment, one or more electrically conductive layers may again be first formed over the integrated circuit structure prior to deposition of the aluminum layer to facilitate adherence of the aluminum to underlying portions of the integrated circuit structure and to prevent interaction between aluminum and silicon in the underlying integrated circuit structure. However, in this embodiment these one or more electrically conductive layers are then patterned, prior to the deposition of the aluminum layer thereon, to form (in these one or more electrically conductive layers) the desired pattern of electrically conductive lines or interconnects. The aluminum metal layer is then deposited over the one or more patterned layers, but the aluminum layer is not patterned prior to the anodization step. A top electrically conductive layer with antireflective properties as earlier described may then be deposited over the aluminum layer. A mask of material resistant to the anodization process, and having openings corresponding to the openings in the previously patterned one or more electrically conductive layers beneath the aluminum layer, is then formed over the aluminum metal layer. The top layer is then patterned through this mask to form openings in the top layer in registry with the openings in the one or more electrically conductive layers beneath the aluminum layer. Then the unmasked (exposed) portions of the aluminum metal layer are subject to the anodization, which is carried out until all of the unmasked portions of the aluminum metal layer have been anodized to form aluminum oxide. As in the prior embodiment, a capping layer of non-porous dielectric material, such as conventional silicon oxide ($SiO_2$), is then formed over the porous anodized aluminum oxide to seal the surface of the porous aluminum oxide.

In either embodiment, the formation of a porous aluminum oxide dielectric material by the anodization of aluminum metal in an acidic electrolyte results in the formation of fine, regular, and almost cylindrical pores which penetrate a close-packed hexagonal cellular structure. The use of anodization of aluminum to form the low k dielectric material provides a porous form of aluminum oxide which results in the low dielectric constant of the dielectric material, while providing the adhesion advantage and low stress of CVD-based low k silicon oxide dielectric layers, and the chemical inertness of porous silicon oxide.

BRIEF DESCRIPTION OF THE DRAWINGS

FIG. 3A is a fragmentary vertical cross-sectional view of a modification of the structure of FIG. 2 wherein a top layer of titanium nitride is formed over the aluminum layer and patterned with the other layers prior to forming a layer of anodized aluminum oxide over the exposed sidewall surfaces of the patterned aluminum.

FIG. 3B is a fragmentary vertical cross-sectional view similar to the structure of FIG. 3 except that the anodized aluminum oxide formed over the exposed surfaces of adjacent aluminum metal lines has been allowed to form until all of the space between adjacent aluminum metal lines is filled with anodized aluminum oxide.

DETAILED DESCRIPTION OF THE INVENTION

The invention comprises an integrated circuit structure having aluminum lines formed thereon which are at least horizontally separated from one another by low k porous aluminum oxide dielectric material formed by anodization of aluminum. In a first embodiment, an aluminum layer is formed over the integrated circuit structure and the aluminum layer is then patterned to form a plurality of aluminum metal lines or interconnects. The patterned aluminum metal lines are then anodized by contacting the exposed surfaces of the patterned aluminum metal lines with an anodizing material, such as an acid anodizing bath, while applying a positive anodizing voltage to the patterned aluminum metal to form anodized aluminum oxide on the exposed upper and sidewall surfaces of the patterned aluminum in contact with the anodizing material. Depending upon the spacing between adjacent aluminum metal lines and the initial thickness of the aluminum metal lines prior to anodization, the anodization may be carried out until the anodized aluminum films on horizontally adjacent aluminum metal lines contact one another, or may be stopped prior to this point, leaving a gap between the anodized aluminum oxide films on adjacent aluminum metal lines. This gap, depending upon its width, may then be either filled with other low k dielectric material or by standard (non-low k) dielectric material such as conventional silicon oxide ($SiO_2$). Finally, a capping layer of non-porous dielectric material, such as conventional silicon oxide ($SiO_2$), which may comprise the material formed in the gap between horizontally adjacent aluminum oxide films on aluminum lines, is formed over the porous anodized aluminum oxide to seal the surface of the porous aluminum oxide.

In a preferred modification of this embodiment, one or more electrically conductive layers are first formed over the integrated circuit structure respectively to facilitate adherence of the aluminum to underlying portions of the integrated circuit structure and to prevent interaction between aluminum and silicon in the underlying integrated circuit structure. Then an antireflective layer of electrically conductive material may be formed over the aluminum layer prior to the step of patterning the composite layer. This top layer may also serve to prevent interaction between the underlying aluminum and other metals formed over the resulting composite layer of metal lines. The resulting composite layer is then patterned prior to the anodization step.

Figure 1:
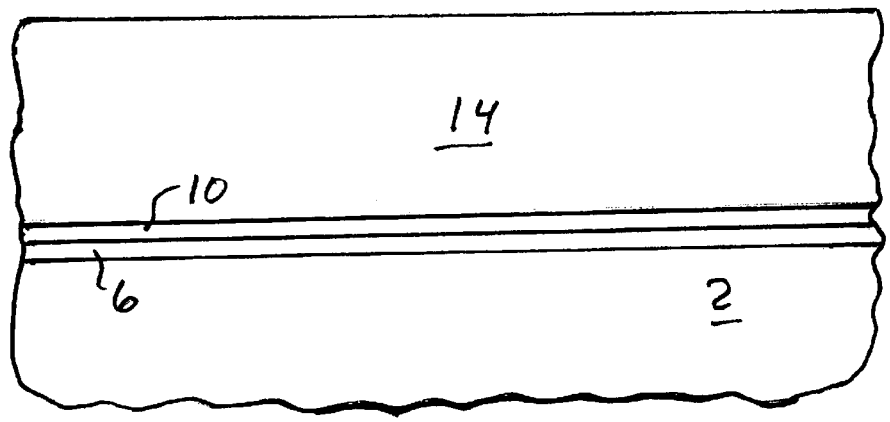
FIG. 1 is a fragmentary vertical cross-sectional view of an integrated circuit structure having formed thereon a titanium metal layer, a titanium nitride layer, and an aluminum metal layer.

Turning to the drawings, FIG. 1 illustrates a fragmentary vertical cross-sectional view of an integrated circuit structure 2 having preferably formed thereon an electrically conductive metal layer 6 such as titanium capable of facilitating adherence of the subsequently formed metal line structure to the underlying integrated circuit structure 2. Layer 6 may range in thickness from about 30 nanometers (nm) to about 60 nm, and typically will be about 40 nm thick. Layer 6 may be hereinafter referred to as a titanium metal layer, by way of illustration and not of limitation.

Over titanium metal layer 6 is preferably formed a further layer 10 of electrically conductive material such as titanium nitride capable of providing a chemical barrier to prevent reaction between silicon in the underlying integrated circuit structure and the subsequently deposited aluminum layer. Electrically conductive layer 10 may range in thickness from about 30 nm to about 70 nm, and typically will be about 50 nm thick. Layer 10 may be hereinafter referred to as a titanium nitride layer, by way of illustration and not of limitation.

Figure 2:
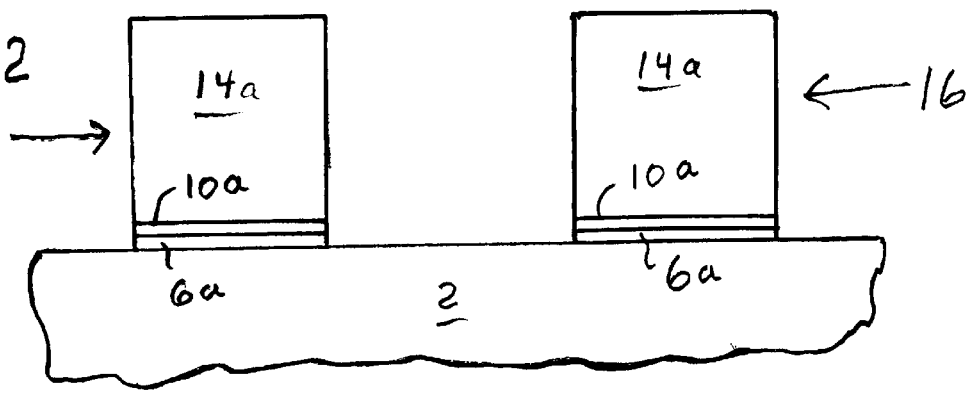
FIG. 2 is a fragmentary vertical cross-sectional view of the structure of FIG. I showing the patterning of the respective layers of titanium metal, titanium nitride, and aluminum metal.

Over titanium nitride layer 10 is formed aluminum layer 14. Aluminum layer 14 may comprise either pure aluminum (e.g., greater than 99 wt. % aluminum) or any alloy of aluminum exhibiting good electrical conductivity. Preferably aluminum layer 14 will comprise an aluminum-copper alloy containing up to about 10 wt. % copper. Aluminum layer 14 usually would vary in thickness for from about 400 nm to about 600 nm, and typically will be about 500 nm in thickness. However, since some of the aluminum (both top and side surfaces) will be consumed during the anodization process, both the thickness (height) and the width of the original unanodized aluminum lines will have to be enlarged to compensate for such losses. The extent of such additional width and thickness will need to be determined empirically depending upon the desired amount of aluminum oxide to be formed on the sidewalls of the aluminum After formation of aluminum layer 14, the structure is masked, with a photoresist mask (not shown) formed by conventional photolithography, and layers 6, 10, and 14 are patterned through the mask to form composite electrically conductive lines generally referred to at 16 in FIG. 2, comprising respective patterned line segments 6a, 10a, and 14a of layers 6, 10, and 14.

Each independent patterned aluminum line 14a is then electrically attached to the positive terminal of a DC power supply and the exposed portions of the aluminum lines are then placed in contact with an anodization media, which may conveniently comprise immersing the entire structure in an acidic anodization bath such as, for example, a phosphoric acid or sulfuric acid bath, and the negative terminal of the DC power supply is connected to a chemically inert electrode (such as a platinum electrode) in contact with the anodization media. Preferably the DC power supply will be a constant current power supply with the current level selected to provide the desired thickness of porous aluminum oxide to be anodically formed over the exposed aluminum. It should be noted that the choice of acid in the anodizing step can, in at least some cases, have an effect on the pore diameter, while the forming voltage may have an effect on the barrier layer and cell wall thickness of the porous aluminum oxide.

Figure 3:
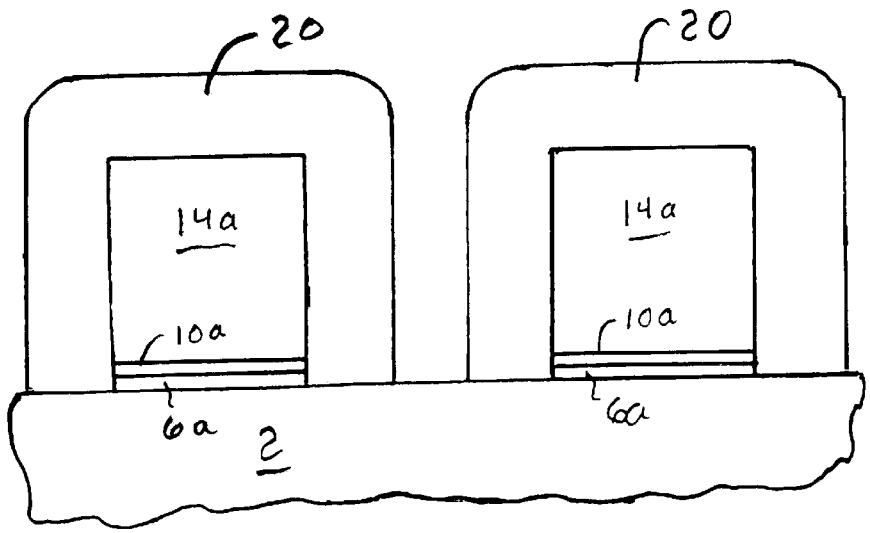
FIG. 3 is a fragmentary vertical cross-sectional view of the structure of FIG. 2 showing a layer of anodized aluminum oxide formed over the exposed surfaces of the patterned aluminum.

FIG. 3 shows the structure after anodization to form a layer 20 of aluminum oxide over the exposed sidewalls and top surfaces of aluminum line 14a. It will be noted that in the illustrated structure, the porous aluminum oxide dielectric material 20 forms on the upper surface of aluminum line 14a as well as on the sidewall surfaces. FIG. 3A shows an modification of this embodiment wherein a patterned top layer segment 30a, comprising for example, a titanium nitride layer, may be formed over aluminum layer 14 prior to patterning of the various layers to form composite line 16 having top segment 30a thereon as shown in FIG. 3A. Such a titanium nitride top layer could serve both as an antireflective coating material and further serve to chemically isolate the aluminum line from further materials (metals, silicon, etc.) formed over composite line 16.

When top layer line segment 30a is present as the top layer of composite line 16 and the aluminum is subsequently subject to the anodization process, porous aluminum oxide dielectric material 22 forms only on the exposed aluminum sidewalls of aluminum line 14a because of the protection of the top surface of aluminum line 14a by top line 30a.

FIG. 3B shows yet another modification of this embodiment wherein the anodization of the exposed aluminum surfaces of aluminum line 14a is carried out until the aluminum oxide dielectric material 20 grown on the respective sidewalls surfaces of adjacent aluminum lines touches or merges, as shown at B in FIG. 3B. In this embodiment there is no need to further fill the space between adjacent aluminum lines with any further dielectric material as will be discussed below. As previously discussed since some of the aluminum, on both the top and sidewall surfaces of the aluminum lines, will be consumed during the anodization process, both the thickness (height) and the width of the original unanodized aluminum lines must be initially enlarged to compensate for such losses. This is particularly the case with regard to the embodiment of FIG. 3B in view of the large amount of aluminum oxide formed in the practice of this embodiment. This is shown at dotted lines A (in FIG. 3B) which represent the original size of aluminum lines 14a prior to anodization.

It should be also noted that the modifications shown in FIGS. 3A and 3B are not mutually exclusive, but rather may be combined together. That is, top line 30a of FIG. 3A may be used in the modification of FIG. 3B to prevent or inhibit vertical growth of aluminum oxide over the top of composite lines 16 during anodization.

In any case, after completion of the anodization step the integrated circuit structure should be removed from the acidic anodization bath, washed and rinsed in flowing distilled water to remove any remaining acid, then washed in a drying agent such as ethanol, and then dried in cool air (e.g., ~20° C.) prior to further processing.

Figure 4:
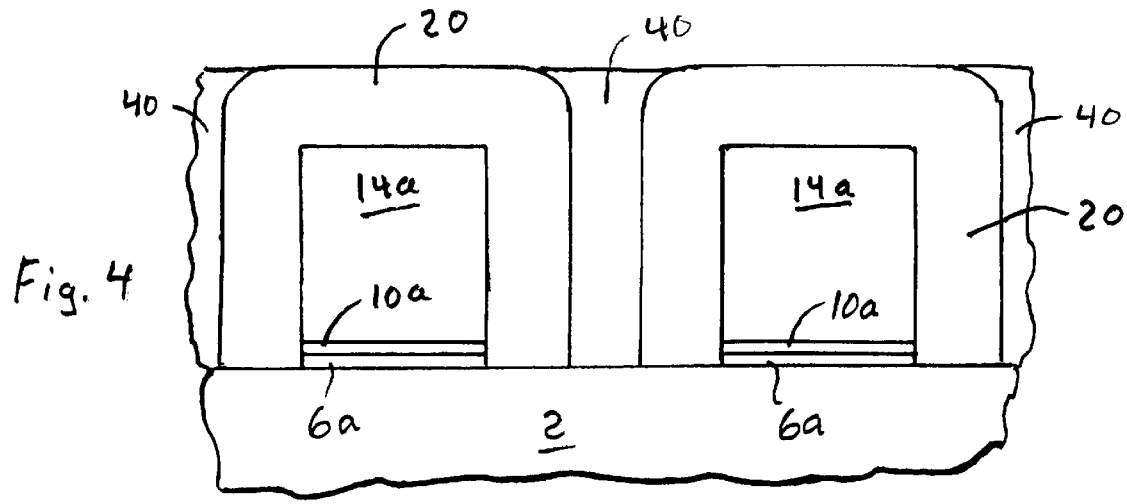
FIG. 4 is a fragmentary vertical cross-sectional view of the structure of FIG. 3 showing dielectric material formed in the gaps between anodized aluminum oxide films on adjacent aluminum lines.

Turning now to FIG. 4, the structure of FIG. 3 is shown with further dielectric material 40 formed in the gaps between films of porous aluminum oxide 20 respectively grown on the sidewalls of adjacent aluminum lines 14a. Preferably, dielectric material 40 will comprise low k dielectric material such as, for example, the low k carbon-doped silicon oxide dielectric material formed by the Flowfill process, using an organic substituted silane with an oxidizing agent such as $H_2O_2$, as described in the previously discussed Peters article.

Dielectric material 40 may also comprise conventional (non-low k) silicon oxide dielectric material formed by any convenient process capable of filling the gaps between the anodically formed porous low k aluminum oxide films formed on adjacent aluminum lines, or at least capable of sealing the gaps, leaving air (which is a low dielectric constant material) trapped therein. Silicon oxide dielectric material formed using tetraethyl orthosilicate (TEOS) and an oxidizing agent such as ozone or an ozone/oxygen ($O_3/O_2$) mixture exhibits good gap filling properties and would be useful as a gap filling silicon oxide dielectric material.

Figure 5:
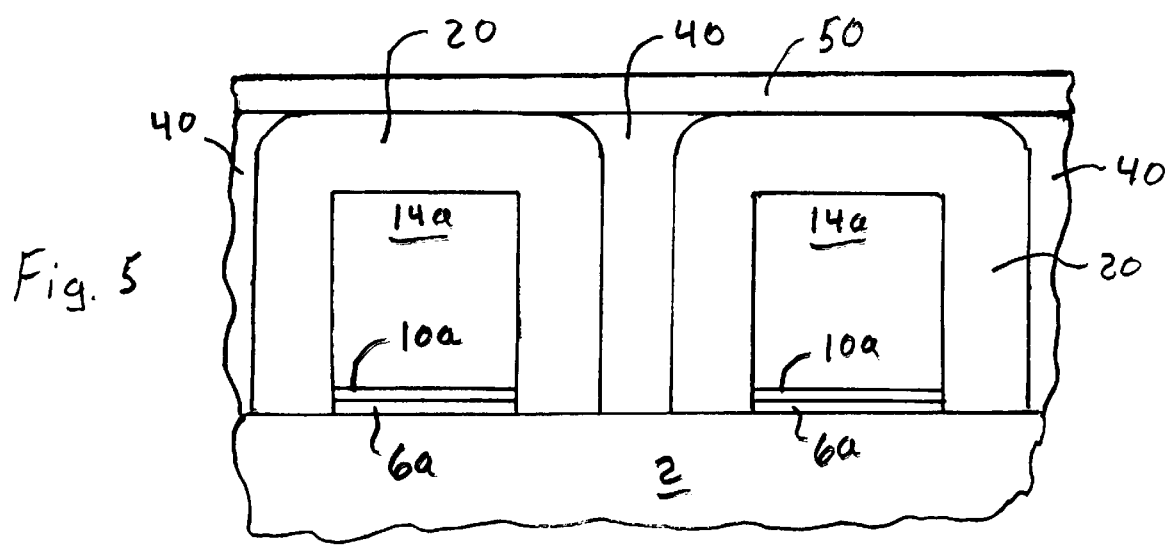
FIG. 5 is a fragmentary vertical cross-sectional view of the structure of FIG. 4 showing a protective capping layer of non-porous dielectric material formed over the low k porous aluminum oxide dielectric material.

After the gaps between the porous aluminum oxide films have been filled or sealed off, a protective capping or sealing layer 50 is preferably formed over the entire structure, as shown in FIG. 5, to seal off any exposed pores in the porous low k aluminum oxide dielectric material, as well as to provide any further vertical spacing needed for the next layer of metal interconnect. Capping layer 50 may range in thickness from about 100 nm to about 300 nm and typically will comprise about 200 nm. Capping layer 50 may comprise any conventional dielectric material such as, for example, conventionally formed (non-low k) non-porous silicon oxide. When the Flowfill process is used to fill the gaps between adjacent films of porous aluminum oxide dielectric, it may be convenient to use the same process to also form capping layer 50, with the organic-substituted silane feed stream (if low k silicon oxide dielectric filler material is used to fill the gaps) changed to silane (after the gaps are filled) to thereby form capping layer 50 over the structure.

If desired, the structure may be subject to a planarizing step, such as a chemical/mechanical polishing (CMP) step to planarize the structure in preparation for further structure to be formed thereover. While such a CMP planarizing step could be carried out before or after formation of capping layer 50, it would be preferable to carry out such a CMP step after formation of capping layer 50 thereon to protect the porous aluminum oxide from exposure to the chemicals in the CMP process. While one of the advantages of the formation and use of the anodically formed porous low k aluminum oxide as a dielectric material is the relative chemical inertness of the material compared, for example, to low k carbon-doped silicon oxide dielectric material, it is advantageous to avoid exposing the pores of the aluminum oxide to chemicals which may become trapped therein and thereafter diffuse out during, for example, subsequent annealing of the integrated circuit structure.

In a second embodiment, one or more electrically conductive layers may again be first formed over the integrated circuit structure prior to deposition of the aluminum layer to facilitate adherence of the aluminum to underlying portions of the integrated circuit structure and to prevent interaction between aluminum and silicon in the underlying integrated circuit structure. However, in this embodiment these one or more electrically conductive layers are then patterned, prior to the deposition of the aluminum layer thereon, to form (in these one or more electrically conductive layers) the desired pattern of electrically conductive lines or interconnects. The aluminum metal layer is then deposited over the one or more patterned layers, but the aluminum layer is not patterned prior to the anodization step. A top electrically conductive layer with antireflective properties as earlier described may then be deposited over the aluminum layer. A mask of material resistant to the anodization process, and having openings corresponding to the openings in the previously patterned one or more electrically conductive layers beneath the aluminum layer, is then formed over the aluminum metal layer. The top layer is then patterned through this mask to form openings in the top layer in registry with the openings in the one or more electrically conductive layers beneath the aluminum layer. Then the unmasked (exposed) portions of the aluminum metal layer are subject to the anodization, which is carried out until all of the unmasked portions of the aluminum metal layer have been anodized to form aluminum oxide. As in the prior embodiment, a capping layer of non-porous dielectric material, such as conventional silicon oxide ($SiO_2$), is then formed over the porous anodized aluminum oxide to seal the surface of the porous aluminum oxide.

Figure 6:
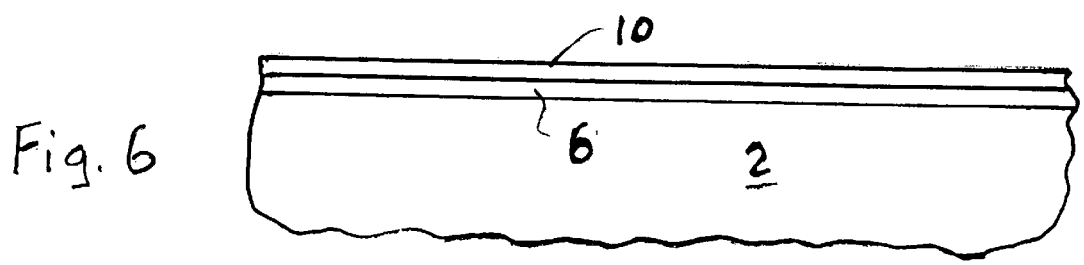
FIG. 6 is a fragmentary vertical cross-sectional view of another embodiment of the invention illustrating an integrated circuit structure having formed thereon a titanium metal layer and a titanium nitride layer, but without the aluminum metal layer of the first embodiment.
Figure 7:
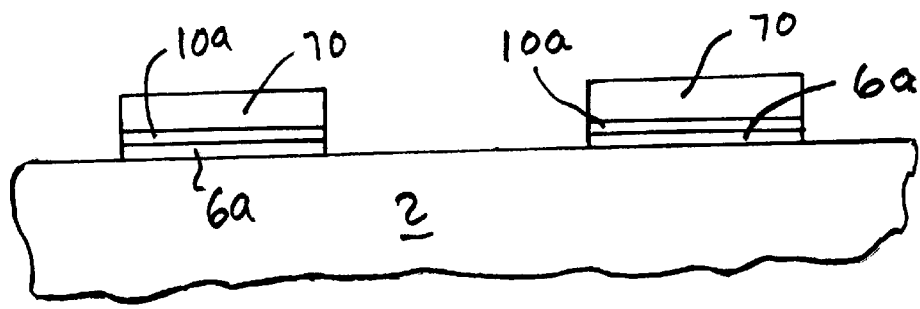
FIG. 7 is a fragmentary vertical cross-sectional view of the structure of FIG. 6 showing the patterning of the respective layers of titanium metal and titanium nitride prior to the deposition of the aluminum metal layer.

This second embodiment of the invention is illustrated in FIGS. 6–9. As shown in FIG. 6, titanium layer 6 and titanium nitride layer 10 are first formed over integrated circuit structure 2, as in the previous embodiment. However, prior to the formation of aluminum layer 14 thereon, layers 6 and 10 are patterned, as shown in FIG. 7, using a first mask 70 having openings therein corresponding to the openings between the electrically conductive lines to be formed over integrated circuit structure 2.

Figure 8:
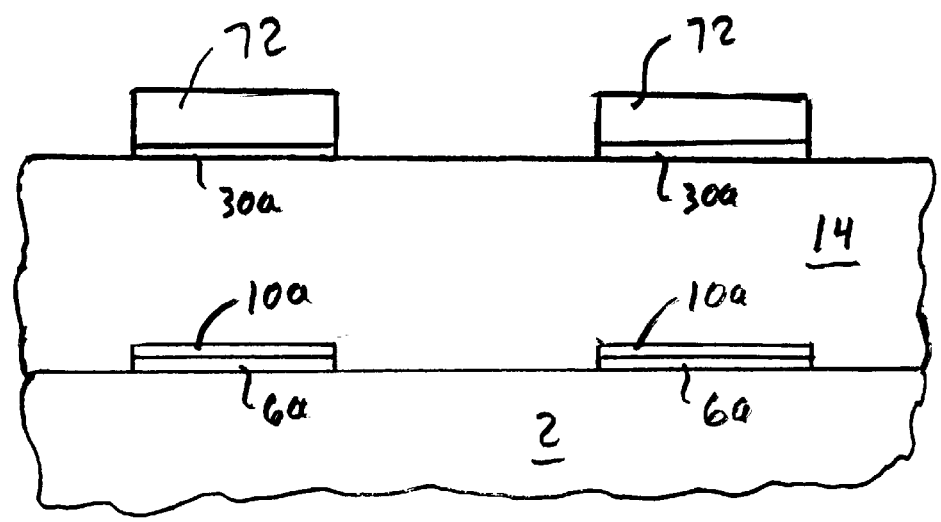
FIG. 8 is a fragmentary vertical cross-sectional view of the structure of FIG. 7 showing the formation of a non-patterned layer of aluminum metal over the patterned layers of titanium metal and titanium nitride, the formation of a patterned top layer of titanium nitride over the non-patterned aluminum layer, and the formation of a mask over the patterned top layer of titanium nitride over the unpatterned aluminum metal, with mask openings corresponding to the openings in the previously patterned layers.

After patterning of titanium line 6 and titanium nitride layer 10 to form line segments 6a and 10a, mask 70 is removed and aluminum layer 14 is formed over the entire structure, as shown in FIG. 8. A top layer of titanium nitride (not shown) is then formed over aluminum layer 14, and a second mask 72 corresponding to first mask 70 is formed over the titanium nitride top layer. The top layer of titanium nitride is patterned through mask 72 to form a pattern of titanium nitride line segments 30a over aluminum layer 14 in registry with line segments 6a and 10a previously formed in layers 6 and 10 beneath aluminum layer 14.

Aluminum layer 14 is then electrically attached to the positive terminal of a DC power supply, preferably a constant current power supply as in the previous embodiment, and the exposed portions of aluminum layer 14, i.e., the portions not covered by mask 72 and titanium nitride portions 30a, are then placed in contact with an anodization media, which may again comprise immersing the entire structure in an anodization bath such as a sulfuric acid bath, and the negative terminal of the DC power supply is connected to a chemically inert electrode in contact with the anodization media. In this embodiment, the anodization is carried out until all of the exposed aluminum in aluminum layer 14 has been anodized to form aluminum oxide between the masked aluminum line segments 14b, as shown in FIG. 9, thereby using the anodizing step to pattern aluminum layer 14.

It should be noted that in this embodiment, it is very important that the anodization process be carried out until all of the aluminum in the unmasked portions of aluminum layer 14 has been anodized completely through to form aluminum oxide, since the failure to do so would result in electrical shorts between adjacent aluminum lines. Such complete anodization endpoint may be monitor by a steep rise in the voltage of the constant current power supply, indicating exhaustion of further unmasked aluminum to be anodized.

Figure 9:
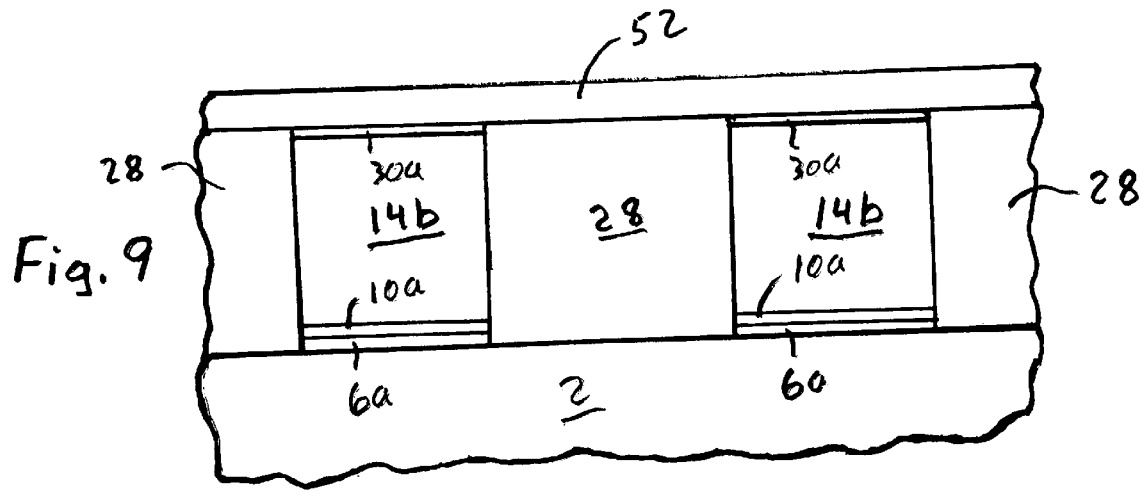
FIG. 9 is a fragmentary vertical cross-sectional view of the structure of FIG. 8 showing anodization of the unmasked portions of the layer of aluminum metal to thereby form a pattern of aluminum metal lines electrically separated from one another by low k porous anodized aluminum oxide dielectric material, followed by removal of the mask and planarization of the structure by CMP, and the subsequent formation of a protective capping layer of non-porous dielectric material over the low k porous aluminum oxide dielectric material.
Figure 9A:
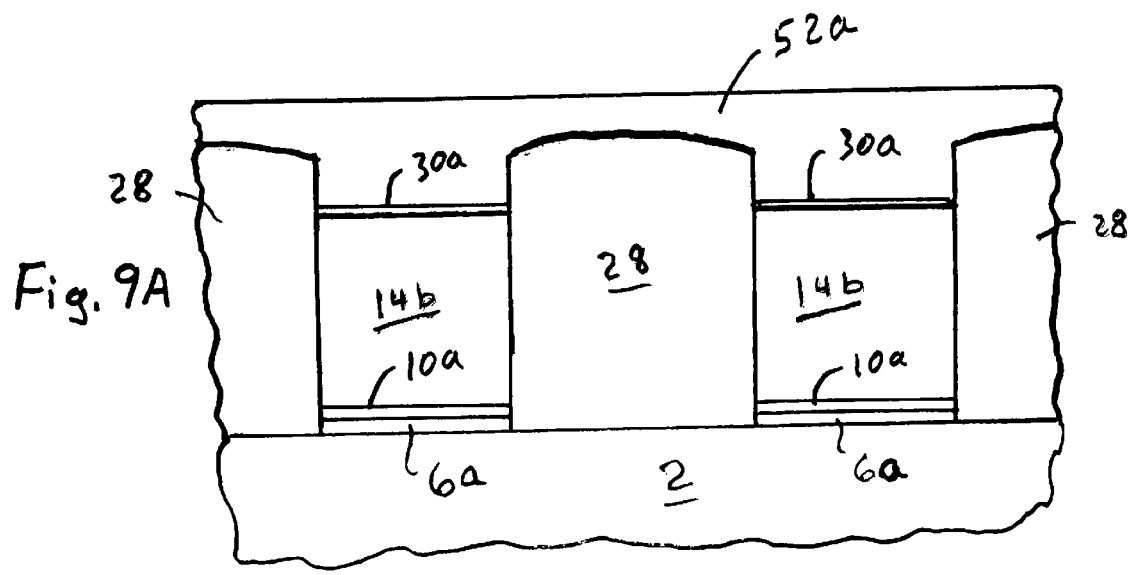
FIG. 9A is a fragmentary vertical cross-sectional view of a modification of FIG. 9 showing anodization of the unmasked portions of the layer of aluminum metal to thereby form a pattern of aluminum metal lines electrically separated from one another by low k porous anodized aluminum oxide dielectric material, followed by removal of the mask without planarization of the structure, and the subsequent formation of a protective capping layer of non-porous dielectric material over the unplanarized structure including the low k porous aluminum oxide dielectric material.

When all of the unmasked aluminum in aluminum layer 14 has been anodized to form low k porous aluminum oxide dielectric material 28, as shown in FIG. 9, the anodization may be stopped, the structure planarized, and a capping layer 52 of non-porous dielectric material may be formed over the entire structure to seal the exposed pores of porous low k aluminum oxide dielectric material as in the previous embodiment. Capping layer 52 may comprise any conventional dielectric material such as, for example, conventionally formed (non-low k) non-porous silicon oxide dielectric material. To avoid exposure of the porous low k aluminum oxide dielectric material to the chemicals used in a CMP planarizing step, a capping layer 52a may be formed directly over the structure without a previous planarizing step, as shown in FIG. 9A, with any further planarization then being carried out on the non-porous dielectric material comprising capping layer 52a.

Because of the need for an extended anodization time period in this embodiment to ensure complete anodization of all of the unmasked aluminum, it is possible that the anodization may not be as anisotropic as would be most desirable, with some undercutting of mask 72 and titanium nitride line segments 30a occurring.

Figure 8A:
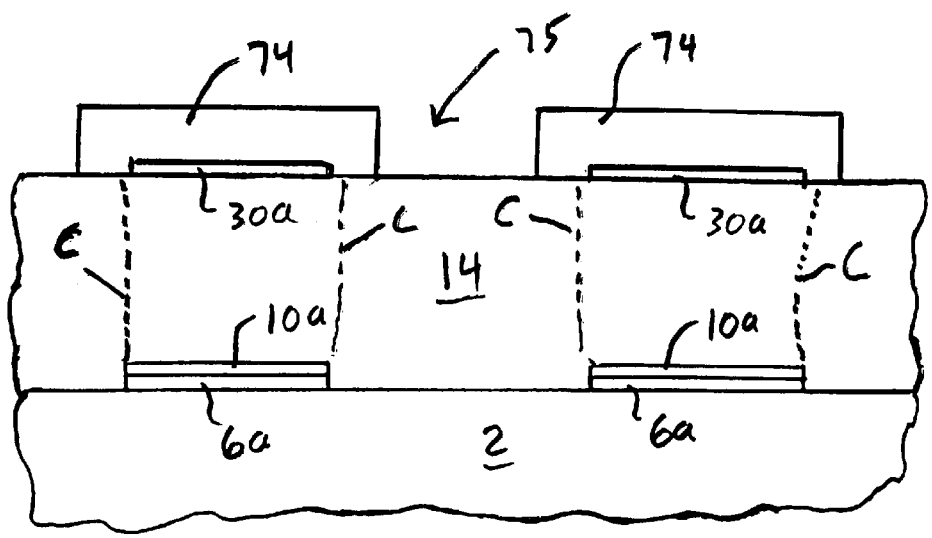
FIG. 8A is a fragmentary vertical cross-sectional view of a modification of FIG. 8 wherein the mask over the patterned top layer of titanium nitride and the non-patterned layer of aluminum metal is oversized, relative to the openings in the previously patterned layers to compensate for anodization of the aluminum undercutting the mask due to incomplete anisotropicity of the aluminum anodization.

To compensate for any such undercutting of the aluminum during the anodization, a mask having deliberately undersized openings could be used, as shown at 74 in FIG. 8A. In the illustrated modification shown in FIG. 8A, the top layer is first masked with a standard mask (not shown) to form top layer line segments 30a, after which such standard mask is removed and replaced with undersized mask 74 having openings 75 of smaller width than the width of the openings between adjacent line segments 6a, 10a, and 30a. If undercutting of mask 74 then occurs during the anodization, as shown in the dotted lines C in FIG. 8A, the remaining width of the unanodized aluminum line segments above line segments 6a and 10a and beneath top line segments 30a will not be unduly narrowed.

In either embodiment, the closely spaced apart metal lines found in modern integrated circuit structures can be separated from one another by anodically formed low k porous aluminum oxide dielectric material.

The use of anodization of aluminum to form the low k dielectric material provides a porous form of aluminum oxide which results in the low dielectric constant of the dielectric material, while providing the adhesion advantage and low stress of CVD-based low k silicon oxide dielectric layers, and the chemical inertness of porous silicon oxide. The pore diameter.of the porous aluminum oxide may be varied, as well as the cell wall thickness, by changes in the anodizing acid and control of the forming voltage during anodizing.

Having thus described the invention what is claimed is:

1. A process for forming an integrated circuit structure having low k porous aluminum oxide dielectric material formed between adjacent spaced apart aluminum metal lines which comprises:

a) forming an aluminum metal layer over an integrated circuit structure;

b) forming a mask aver said aluminum metal layer, said mask patterned to provide mask segments over portions of said metal layer where said adjacent aluminum metal lines will be formed;

c) patterning said aluminum layer through said mask to form masked adjacent aluminum metal lines;

d) electrically connecting said masked adjacent aluminum metal lines to the positive terminal of a DC power source;

e) contacting said masked adjacent aluminum metal lines with an acidic anodizing media having an electrode therein connected to the negative terminal of said DC power source; and f) anodizing exposed sidewall portions of said masked adjacent aluminum metal lines to form porous low k aluminum oxide dielectric material between said adjacent aluminum metal line portions;

to thereby form a structure of said adjacent aluminum metal lines separated from one another by anodically formed porous low k aluminum oxide dielectric material.

2. The process of claim 1 including the further steps of forming a titanium metal layer over said integrated circuit structure prior to said step of forming said aluminum metal layer, and said step of patterning said aluminum metal layer further includes also patterning said titanium metal layer with the same mask.

3. The process of claim 1 including the further steps of forming a titanium nitride metal layer over said integrated circuit structure prior to said step of forming said aluminum metal layer, and said step of patterning said aluminum metal layer further includes also patterning said titanium nitride layer with the same mask.

4. The process of claim 1 including the further steps of:
 a) forming a titanium metal layer, over said integrated circuit structure prior to said step of forming said aluminum metal layer;
 b) then forming a titanium nitride layer over said titanium metal layer prior to said step of forming said aluminum metal layer; and
 c) patterning said titanium metal layer and said titanium nitride layer during said step of patterning said aluminum metal layer.

5. The process of claim 1 wherein said step of anodizing said exposed portions of said aluminum layer further comprises anodizing said exposed portions of said aluminum metal layer using a constant current DC power source.

6. A process for forming an integrated circuit structure having low k porous aluminum oxide dielectric material formed between adjacent spaced apart aluminum metal lines which comprises:
 a) forming a layer of titanium metal over an integrated circuit structure;
 b) forming a layer of titanium nitride over said titanium metal layer;
 c) forming a layer of aluminum metal over said titanium nitride layer;
 d) forming a non-porous capping layer of dielectric material over said layer of aluminum;
 e) forming a mask over said non-porous capping layer, said mask patterned to provide mask segments over portions of said layers where said adjacent aluminum metal lines will be formed;
 f) patterning through said mask said capping layer, said aluminum layer, and said titanium and titanium nitride layers underlying said aluminum metal layer to form said adjacent aluminum metal lines;
 g) electrically connecting said adjacent aluminum metal lines to the positive terminal of a constant current DC power source;
 h) immersing said adjacent aluminum metal lines in an acidic anodizing bath having an electrode therein connected to the negative terminal of said DC power source; and
 i) anodizing exposed sidewall portions of said adjacent aluminum metal lines to form porous low k anodized aluminum oxide dielectric material between said adjacent aluminum metal line portions;

to thereby form a structure of said adjacent aluminum metal lines horizontally separated from one another by anodically formed porous low k aluminum oxide dielectric material.

7. A process for forming an integrated circuit structure having low k porous aluminum oxide dielectric material formed between horizontally adjacent spaced apart aluminum metal lines which comprises:
 a) forming an aluminum metal layer over an integrated circuit structure;
 b) forming a non-porous capping layer of dielectric material over said aluminum layer;
 c) forming a mask over said non-porous capping layer of dielectric material and said aluminum metal layer, said mask patterned to provide mask segments over portions of said dielectric layer and said aluminum metal layer where said horizontally adjacent aluminum metal lines will be formed;
 d) patterning said non-porous capping layer of dielectric material and said aluminum layer through said mask to form said horizontally adjacent aluminum metal lines each capped with said non-porous capping material;
 e) electrically connecting said horizontally adjacent capped aluminum metal lines to the positive terminal of a DC power source;
 f) contacting the exposed sidewall surfaces of said horizontally adjacent capped aluminum metal lines with an acidic anodizing media having an electrode therein connected to the negative terminal of said DC power source; and
 g) anodizing said exposed sidewall surfaces of said horizontally adjacent capped aluminum metal lines to form porous low k aluminum oxide dielectric material between said horizontally adjacent aluminum metal line portions until all of the space between said horizontally adjacent capped aluminum metal lines is filled with said anodized aluminum oxide;

to thereby form a structure comprising said horizontally adjacent capped aluminum metal lines separated from one another only by anodically formed porous low k aluminum oxide dielectric material.

* * * * *